(12) United States Patent
Sugo et al.

(10) Patent No.: US 6,703,133 B2
(45) Date of Patent: Mar. 9, 2004

(54) POLYIMIDE SILICONE RESIN, ITS SOLUTION COMPOSITION, AND POLYIMIDE SILICONE RESIN FILM

(75) Inventors: Michihiro Sugo, Annaka (JP); Hideto Kato, Takasaki (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 194 days.

(21) Appl. No.: 09/892,445

(22) Filed: Jun. 28, 2001

(65) Prior Publication Data

US 2002/0016408 A1 Feb. 7, 2002

(30) Foreign Application Priority Data

Jun. 29, 2000 (JP) .................................. 2000-196843

(51) Int. Cl.⁷ .............................................. C08G 77/26
(52) U.S. Cl. ......................... 428/447; 528/26; 528/28; 528/38
(58) Field of Search ........................ 528/28, 26, 38; 428/447

(56) References Cited

U.S. PATENT DOCUMENTS

| | | | |
|---|---|---|---|
| 3,338,859 A | | 8/1967 | Green |
| 4,690,997 A | * | 9/1987 | Cella et al. ............. 528/26 |
| 4,808,686 A | * | 2/1989 | Cella et al. ............. 528/27 |
| 5,041,513 A | | 8/1991 | Okinoshima et al. |
| 5,693,735 A | | 12/1997 | Sugo et al. |
| 5,714,572 A | | 2/1998 | Kato ..................... 528/310 |
| 5,852,153 A | | 12/1998 | Sugo et al. |

* cited by examiner

Primary Examiner—Margaret G. Moore
(74) Attorney, Agent, or Firm—Oblon, Spivak, McClelland, Maier & Neustadt, P.C.

(57) ABSTRACT

A polyimide silicone resin which is obtained from a diamine containing an acid dianhydride and a diaminopolysiloxane, contains 50% by weight or more of a siloxane residual group and has an elongation at rupture of 400% or higher and a modulus of elasticity of 500 N/mm² or lower. Also disclosed are a polyimide silicone resin solution composition comprising this polyimide silicone resin and a ketone solvent having a boiling point of 130° C. or below, and a polyimide silicone resin film comprising this polyimide silicone resin and formed on a substrate. The polyimide silicone resin can form films at relatively low temperature, has superior adhesiveness to substrates and durability under conditions of high humidity and also has low stress and high elongation.

13 Claims, No Drawings

POLYIMIDE SILICONE RESIN, ITS SOLUTION COMPOSITION, AND POLYIMIDE SILICONE RESIN FILM

BACKGROUND OF THE INVENTION

1. Field of the Invention

This invention relates to a polyimide silicone resin effectively utilizable for uses in, e.g., prevention of corrosion of liquid-crystal display panel electrodes and surface protection of wiring component parts of semiconductor devices and printed circuit boards, and also relates to its solution composition and a polyimide silicone resin film.

2. Description of the Prior Art

Room temperature-vulcanizable (RTV) silicones are widely used in protective materials for electrodes of liquid-crystal display panels, the electrodes being formed of, e.g., ITO (indium tin oxide). However, as display devices have been improved in performances in recent years, specifically, their panels, weights and thickness have been made larger, lighter and thinner, respectively. Also, as liquid-crystal display panels have become used in a wide range of purposes, severer properties have become required for electrode protective materials. Accordingly, it has been sought to bring out more highly reliable electrode protective materials.

Meanwhile, polyimide silicone resins have energetically been researched and developed in recent years. They, however, are usually only known as those of a type which can be diluted in a high-boiling solvent or as those of a type which can be used as solutions in the state of polyamic acid (i.e., the precursor of polyimide), i.e., solutions of polyamic acid silicone resins. In the case of the polyimide silicone resins of the type which is diluted in a high-boiling solvent, the solvent must be removed at a high-temperature to effect curing in order to obtain the desired films. Hence, such resins are not adaptable as electrode protective materials for liquid-crystal display panels not resistant to high temperatures. Similarly, the polyamic acid silicone resin solutions must be treated at a high temperature of 200° C. or above in order to effect imidization; thus, in this case, too, the resins are not suitable as electrode protective materials for liquid-crystal display panels.

The electrode protective materials are also required not to impart any stress to the display panels. However, conventional polyimide silicone resins can not endow films with elasticity, compared to room temperature-vulcanizable (RTV) silicones, and may cause warpage in the display panels because of shrinkage on curing.

SUMMARY OF THE INVENTION

Under such circumstances, objects of the present invention are to provide a polyimide silicone resin which can form films at relatively low temperature, has superior adhesiveness to substrates and durability under conditions of high humidity and also has low stress and high elongation, to provide a polyimide silicone resin solution composition used to form films, and to provide a polyimide silicone resin film which may cause neither warpage nor copper sheet corrosion when used in electrode protective films for electronic component parts or semiconductor devices.

As a result of extensive studies, the present inventors have discovered that a polyimide silicone resin derived from a diamine comprising a diaminopolysiloxane and an acid dianhydride, which comprises at least 50% by weight of a siloxane residual group, and has an elongation at rupture of 400% or higher and a modulus of elasticity of 500 N/mm² or lower, its solution composition and a film comprised of the composition and formed on a substrate, can achieve the above objects. Thus, they have accomplished the present invention.

That is, the present invention in the first aspect provides a polyimide silicone resin derived from a diamine comprising a diaminopolysiloxane and an acid dianhydride, which comprises at least 50% by weight of a siloxane residual group, and has an elongation at rupture of 400% or higher and a modulus of elasticity of 500 N/mm² or lower.

The present invention in the second aspect provides a polyimide silicone resin solution composition comprising the above polyimide silicone resin and a ketone solvent having a boiling point of 130° C. or below.

The present invention in the third aspect provides a polyimide silicone resin film comprising the above polyimide silicone resin and formed on a substrate.

DESCRIPTION OF THE PREFERRED EMBODIMENTS

The present invention will be described below in detail.

The polyimide silicone resin is obtained from a diamine comprising a diaminopolysiloxane and an acid dianhydride.

The acid dianhydride which may be used for the polyimide silicone resin of the present invention includes, e.g., 4,4'-hexafluoropropylidenebisphthalic dianhydride (6FDA), 3,3',4,4'-diphenylsulfonetetracarboxylic dianhydride, 3,3',4,4'-biphenyltetracarboxylic dianhydride, 4,4'-benzophenonetetracarboxylic dianhydride, and ethylene glycol bistrimellitic dianhydride. In particular, 6FDA and 3,3',4,4'-diphenylsulfonetetracarboxylic dianhydride are preferred. Any of these may be used alone or in combination of two or more types.

The diamine which can used for the polyimide silicone resin of the present invention preferably includes, in addition to the diaminopolysiloxane, e.g., diamines represented by the general formula (2):

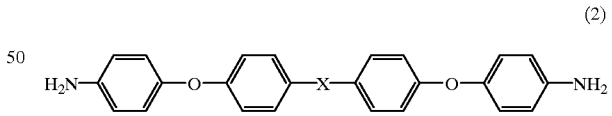

(2)

wherein X represents —C(CH$_3$)$_2$—, —C(CF$_3$)$_2$— or —SO$_2$—. The diamines represented by the general formula (2) includes 2,2-bis[4-(4-aminophenoxy)phenyl]propane, 2,2-bis[4-(4-aminophenoxy)phenyl]hexafluoropropane, and bis-4-(4-aminophenoxy)phenylsulfone. Any of these may be used alone or in combination of two or more. In particular, 2,2-bis[4-(4-aminophenoxy)phenyl]propane is preferred.

As the diaminopolysiloxane used in the polyimide silicone resin of the present invention, compounds represented by the following general formula (1) are preferred, any of which may be used alone or in combination of two or more types.

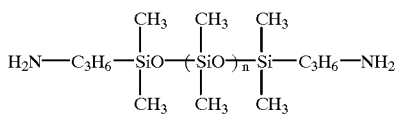

(1)

wherein n represents the number of repetition of dimethylsiloxane unit, and is an integer of 0 or more, preferably 0 to 120, and more preferably 0 to 90.

The siloxane residual group in the present invention is meant to be a group represented by —(R)$_2$SiO— where R represents an alkyl group such as methyl, ethyl, propyl, phenyl groups, and the content of the siloxane residual group can be determined according to the following expression for calculation.

Siloxane residual group content (% by weight)=(weight of siloxane residual group calculated from the weight of the diaminopolysiloxane used)/(weight of polyimide silicone resin to be produced theoretically from the weights of the raw materials used)×100

In the polyimide silicone resin of the present invention, the siloxane residual group is in a content of 50% by weight or more, and preferably from 55 to 75% by weight. If it is in a content less than 50% by weight, the resin may cause a great shrinkage on curing.

The polyimide silicone resin of the present invention has an elongation at rupture of 400% or higher. It also has a modulus of elasticity of 500 N/mm$^2$ or lower, and preferably 100 N/mm$^2$ or lower. If it has an elongation at rupture lower than 400% or a modulus of elasticity higher than 500 N/mm$^2$, the resin may cause distortion such as warpage in the panel after it has been formed into the polyimide silicone resin film.

In the present invention, the polyimide silicone resin may preferably less contain a cyclic siloxane oligomer having 20 or less silicon atoms. The cyclic siloxane oligomer having 20 or less silicon atoms is represented by the formula:

$$[(CH_3)_2SiO]_n$$

wherein n is an integer of 3 to 20. For example, when n is 3, it is hexamethylcyclotrisiloxane and, when n is 4, octamethylcyclotetrasiloxane. These cyclic siloxane oligomers are volatile, and are known to cause what is called silicone trouble, such as trouble in electrical contacts. Accordingly, where the resin is used for electric and electronic purpose, these cyclic siloxane oligomers may preferably be in a content as small as possible. In order for the resin not to cause this silicone trouble such as trouble in electrical contacts, such volatile silicones in the polyimide silicone resin may preferably be in a content not more than 300 ppm, and more preferably not more than 100 ppm.

As solvents used in the present invention to obtain the polyimide silicone resin solution composition, there are no particular limitations thereon as long as the solvent can dissolve the polyimide silicone resin. Preferably, the solvent may preferably be a ketone solvent having a boiling point of 130° C. or below. The ketone solvent having a boiling point of 130° C. or below may include, e.g., acetone, 2-butanone and 4-methyl-2-pentanone.

In the present invention, the polyimide silicone resin can be produced by any known process. For example, a preferable polyimide silicone resin can be produced in the following way.

In an atmosphere of an inert gas, an acid dianhydride, e.g., 4,4'-hexafluoropropylidenebisphthalic dianhydride (6FDA), a diaminosiloxane, and optionally a diamine other than the diaminosiloxane, e.g., 2-bis[4-(4-aminophenoxy)phenyl]propane (BAPP) are charged into a solvent such as cyclohexanone to allow them to react at a low temperature, i.e., at about 10 to 50° C. to synthesize a polyamic acid which is a precursor of the polyimide resin.

Here, the ratio of the diamine comprising the diaminopolysiloxane to the acid dianhydride may be in the range of from 0.95 to 1.05, and preferably from 0.98 to 1.02, in molar ratio. Also, the proportion of the diaminopolysiloxane in the diamine component may be from 0.7 to 1.0.

Subsequently, the resultant polyamic acid solution composition is heated to a temperature usually in the range of from 100 to 200° C., and preferably from 140 to 180° C., to cause the acid amide moiety of the polyamic acid to undergo dehydration cyclization reaction to obtain the polyimide silicone resin in the form of a solution composition. Here, toluene, xylene or the like may be added for the purpose of azeotropic dehydration to accelerate the dehydration cyclization.

As a solvent which may be used when the polyimide silicone resin of the present invention is synthesized, it may preferably be a non-reactive solvent capable of dissolving the polyimide silicone resin to be formed. Such a solvent may include, e.g., N-methyl-2-pyrrolidone, γ-butyrolactone and N,N-dimethylacetamide.

The polyimide silicone resin thus obtained may have a weight-average molecular weight (in terms of polystyrene) of from 5,000 to 150,000, and preferably from 10,000 to 100,000, as measured by gel permeation chromatography (GPC).

The polyimide silicone resin solution composition of the present invention may be coated on a substrate such as a metal sheet or plate, a glass sheet or plate, a ceramic substrate or a silicon wafer by a known process such as spin coating, dipping or potting. Thereafter, the coating formed may be dried under conditions of a temperature of from room temperature to 100° C. during a few minutes to a few hours, thus the polyimide silicone resin film can be obtained with ease. The polyimide silicone resin film of the present invention has superior mechanical properties and electrical properties, and hence is preferably usable as an electrode protective material for electronic component parts or semiconductor devices. Stated specifically, it is preferably usable as an electrode protective film for TFT liquid-crystal display panels, STN liquid-crystal display panels or plasma display panels, as a junction film for ICs and as a conformal coating of printed circuit boards.

EXAMPLES

The present invention is described below in greater detail by giving Examples. The present invention is by no means limited to these Examples. In the following, compounds shown below are abbreviated as shown below. 3,3',4,4'-Diphenylsulfonetetracarboxylic dianhydride: DSDA 4,4'-Hexafluoropropylidenebisphthalic dianhydride: 6FDA 2,2-Bis[4-(4-aminophenoxy)phenyl]propane: BAPP The elongation at rupture and the modulus of elasticity were measured according to JIS K6249.

Example 1

Into a flask having a stirrer, a thermometer and a nitrogen displacement unit, 88.8 g (0.2 mol) of 6FDA and 700 g of cyclohexanone were charged. Then, a solution prepared by dissolving 147.9 g (0.17 mol) of a diaminosiloxane (the compound of the general formula (1) in which n is 10 on the average) and 12.3 g (0.03 mol) of BAPP in 50 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 50 g of toluene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation. The resultant precipitate was dried to obtain a polyimide silicone resin.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofuran as a solvent to find that it was 30,000, having siloxane residual groups in an amount of 52% by weight. The content of the cyclic siloxane oligomer having 20 or less silicon atoms was 200 ppm. The elongation at rupture and modulus of elasticity of the resin were 480% and 8 N/mm$^2$, respectively. A solution prepared by dissolving this resin in 4-methyl-2-pentanone was obtained as a polyimide silicone resin solution, and was used for the observation of any warpage and for a corrosion test as described later.

Example 2

Into a flask having a stirrer, a thermometer and a nitrogen displacement unit, 88.8 g (0.2 mol) of 6FDA and 700 g of cyclohexanone were charged. Then, a solution prepared by dissolving 2.5 g (0.01 mol) of a diaminosiloxane (the compound of the general formula (1) in which n is 0 on the average), 187 g (0.15 mol) of a diaminosiloxane (the compound of the general formula (1) in which n is 15 on the average) and 16.4 g (0.04 mol) of BAPP in 50 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 50 g of toluene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation. The resultant precipitate was dried to obtain a polyimide silicone resin.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofuran as a solvent to find that it was 35,000, having siloxane residual groups in an amount of 57% by weight. The content of the cyclic siloxane oligomer having 20 or less silicon atoms was 60 ppm. The elongation at rupture and modulus of elasticity of the resin were 600% and 2.5 N/mm$^2$, respectively. A solution prepared by dissolving this resin in 4-methyl-2-pentanone was obtained as a polyimide silicone resin solution, and was used for the observation of any warpage and for a corrosion test as described later.

Example 3

Into a flask having a stirrer, a thermometer and a nitrogen displacement unit, 71.6 g (0.2 mol) of DSDA and 600 g of cyclohexanone were charged. Then, a solution prepared by dissolving 2.5 g (0.01 mol) of a diaminosiloxane (the compound of the general formula (1) in which n is 0 on the average), 162.2 g (0.13 mol) of a diaminosiloxane (the compound of the general formula (1) in which n is 15 on the average) and 32.8 g (0.08 mol) of BAPP in 100 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 50 g of toluene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofliran as a solvent to find that it was 31,000, having siloxane residual groups in an amount of 55% by weight. The content of the cyclic siloxane oligomer having 20 or less silicon atoms was 100 ppm. The elongation at rupture and modulus of elasticity of the resin were 450% and 18 N/mm$^2$, respectively. A solution prepared by dissolving this resin in 2-butanone was obtained as a polyimide silicone resin solution, and was used for the observation of any warpage and for a corrosion test as described later.

Example 4

Into a flask having a stirrer, a thermometer and a nitrogen displacement unit, 88.8 g (0.2 mol) of 6FDA and 700 g of cyclohexanone were charged. Then, a solution prepared by dissolving 2.5 g (0.01 mol) of a diaminosiloxane (the compound of the general formula (1) in which n is 0 on the average), 112.2 g (0.09 mol) of a diaminosiloxane (the compound of the general formula (1) in which n is 15 on the average), 108 g (0.02 mol) of a diaminosiloxane (the compound of the general formula (1) in which n is 72 on the average) and 32.8 g (0.08 mol) of BAPP in 100 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 50 g of toluene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation. The resultant precipitate was dried to obtain a polyimide silicone resin.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofuran as a solvent to find that it was 35,000, having siloxane residual groups in an amount of 60% by weight. The content of the cyclic siloxane oligomer having 20 or less silicon atoms was 80 ppm. The elongation at rupture and modulus of elasticity of the resin were 400% and 22 N/mm$^2$, respectively. A solution prepared by dissolving this resin in 2-butanone was obtained as a polyimide silicone resin solution, and was used for the observation of any warpage and for a corrosion test as described later.

Comparative Example 1

Into a flask having a stirrer, a thermometer and a nitrogen displacement unit, 88.8 g (0.2 mol) of 6FDA and 600 g of cyclohexanone were charged. Then, a solution prepared by dissolving 2.5 g (0.01 mol) of a diaminosiloxane (the compound of the general formula (1) in which n is 0 on the average), 74.8 g (0.06 mol) of a diaminosiloxane (the compound of the general formula (1) in which n is 15 on the average) and 53.4 g (0.13 mol) of BAPP in 100 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 50 g of toluene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofuran as a solvent to find that it was 38,000, having siloxane residual groups in an amount of 31% by weight. The content of the cyclic siloxane oligomer having 20 or less silicon atoms was 40 ppm. The elongation at rupture and modulus of elasticity of the resin were 80% and 900 N/mm$^2$, respectively. A solution prepared by dissolving this resin in 4-methyl-2-pentanone was obtained as a polyimide silicone resin solution, and was used for the observation of any warpage and for a corrosion test as described later.

Comparative Example 2

Into a flask having a stirrer, a thermometer and a nitrogen displacement unit, 71.6 g (0.2 mol) of DSDA and 600 g of cyclohexanone were charged. Then, a solution prepared by dissolving 87.0 g (0.1 mol) of a diaminosiloxane (the compound of the general formula (1) in which n is 10 on the average) and 41.1 g (0.1 mol) of BAPP in 100 g of cyclohexanone was dropwise added into the flask while the temperature of the reaction system was so controlled as not to become higher than 50° C. After their addition was completed, the mixture formed was further stirred at room temperature for 10 hours. Next, a reflux condenser having a water-receiving container was attached to the flask, and thereafter 30 g of xylene was added, followed by heating to 150° C. This temperature was kept for 6 hours, whereupon a yellowish brown solution was obtained.

The yellowish brown solution thus obtained was cooled to room temperature (25° C.), which was thereafter put into methanol to effect reprecipitation.

Infrared light absorption spectra of the resin having been reprecipitated were measured, where any absorption due to polyamic acid showing the presence of unreacted functional groups did not appear, and absorption due to imide groups was seen at 1,780 cm$^{-1}$ and 1,720 cm$^{-1}$. Weight-average molecular weight (in terms of polystyrene) of the resin was measured by gel permeation chromatography (GPC) using tetrahydrofuran as a solvent to find that it was 35,000, having siloxane residual groups in an amount of 37% by weight. The content of the cyclic siloxane oligomer having 20 or less silicon atoms was 80 ppm. The elongation at rupture and modulus of elasticity of the resin were 120% and 650 N/mm$^2$, respectively. A solution prepared by dissolving this resin in 2-butanone was obtained as a polyimide silicone resin solution, and was used for the observation of any warpage and for a corrosion test as described later.

Comparative Example 3 (RTV)

90 g of a dimethylpolysiloxane having silanol groups at both terminals and having a viscosity of 700 mm$^2$/s, 10 g of silica having a specific surface area of 200 m$^2$/g, 6 g of methyltrimethoxysilane, 0.5 g of tetramethylguanidylpropyltrimethoxysilane, 1 g of 3-aminopropyltrimethoxysilane and 0.3 g of dibutyltin dioctate were mixed to obtain a RTV silicone composition. Its elongation at rupture after curing was 150%. The cured RTV silicone composition was used for the observation of any warpage and for a corrosion test as described below.

Evaluation (a) Observation of Warpage (Distortion)

On a 0.1 mm thick glass sheet, the polyimide silicone resin solutions obtained in Examples 1 to 4 and Comparative Examples 1 and 2 were each so coated that the resin was 80 μm thick, and the solvent was removed under conditions of 50° C./0.5 hr. Thereafter, whether or not the glass sheet distorted (warped) was observed. In the case of the RTV obtained in Comparative Example 3, too, it was likewise so coated that the RTV was 80 μm thick, and whether or not the glass sheet distorted (warped) after curing at room temperature for 24 hours was observed.

(b) Corrosion Test

On a 0.3 mm thick copper sheet, the polyimide silicone resin solutions obtained in Examples 1 to 4 and Comparative Examples 1 and 2 were each so coated that the resin was 80 μm thick, and the solvent was removed under conditions of 50° C./1 hr. Thereafter, whether or not the copper sheet corroded after exposure for 240 hours in a high-temperature and high-humidity environment of 80° C./95% RH was observed. In the case of the RTV obtained in Comparative Example 3, too, it was likewise so coated that the RTV was 80 μm thick, and whether or not the copper sheet corroded after exposure for 240 hours in a high-temperature and high-humidity environment of 80° C./95% RH after curing at room temperature for 24 hours was observed.

Results of the observation of warpage and corrosion test are shown in Table 1 below.

TABLE 1

| | Elongation at rupture (%) | Modulus of elasticity (N/mm$^2$) | Glass sheet warpage | Copper sheet corrosion |
| --- | --- | --- | --- | --- |
| Example 1 | 480 | 8 | no | no |
| Example 2 | 600 | 2.5 | no | no |
| Example 3 | 450 | 18 | no | no |
| Example 4 | 400 | 22 | no | no |
| Comparative Example 1 | 80 | 900 | yes | no |
| Comparative Example 2 | 120 | 650 | yes | no |
| Comparative Example 3 | 150 | — | no | yes |

As described above, the polyimide silicone resin of the present invention can form films at relatively low temperature, has superior adhesiveness to substrates and durability under conditions of high humidity and also has low stress and high elongation. Also, the solution composition prepared by dissolving this polyimide silicone resin in the solvent can form the polyimide silicone resin film with ease. The polyimide silicone resin film obtained from this polyimide silicone resin solution composition may cause neither warpage nor copper sheet corrosion when applied on glass sheets or copper sheets, and hence it is useful as an electrode protective film or moistureproofing protective film for electronic component parts, liquid-crystal display panels or semiconductor devices.

What is claimed is:

1. A polyimide silicone resin derived from
   a diamine comprising a diaminopolysiloxane and
   an acid dianhydride, wherein
   the resin comprises at least 50% by weight of a siloxane residual group;
   the resin has an elongation at rupture of 400% or higher and a modulus of elasticity of 500 N/mm$^2$ or lower; and
   the acid dianhydride is at least one selected from the group consisting of
   4,4'-hexafluoropropylidenebisphthalic dianhydride,
   3,3',4,4'-diphenylsulfonetetracarboxylic dianhydride,
   3,3',4,4'-biphenyltetracarboxylic dianhydride,
   4,4'-benzophenonetetracarboxylic dianhydride, and
   ethylene glycol bistrimellitic dianhydride.

2. The polyimide silicone resin according to claim 1, wherein said acid dianhydride is at least one selected from the group consisting of 4,4'-hexafluoropropylidenebisphthalic dianhydride and 3,3',4,4'-diphenylsulfonetetracarboxylic dianhydride.

3. The polyimide silicone resin according to claim 1, wherein the diamine comprises a diaminopolysiloxane represented by the following general formula (1):

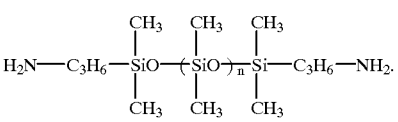

(1)

wherein n is an integer of 0 to 120.

4. The polyimide silicone resin according to claim 1, wherein the diamine further comprises a diamine represented by the general formula (2):

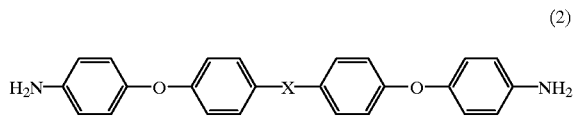

(2)

wherein X represents —C(CH$_3$)$_2$—, —C(CF$_3$)$_2$— or —SO$_2$—.

5. The polyimide silicone resin according to claim 1, wherein the siloxane residual group is in a content of 55 to 75% by weight.

6. The polyimide silicone resin according to claim 1, wherein it has a modulus of elasticity of 100 N/mm$^2$ or lower.

7. The polyimide silicone resin according to claim 1, which contains not more than 300 ppm of a cyclic siloxane oligomer having 20 or less silicon atoms.

8. The polyimide silicone resin according to claim 7, which contains not more than 100 ppm of the cyclic siloxane oligomer.

9. A polyimide silicone resin solution composition comprising a polyimide silicone resin according to claim 1 and an organic solvent capable of dissolving the polyimide silicone resin therein.

10. The polyimide silicone resin solution composition according to claim 9, wherein said solvent is a ketone solvent having a boiling point of 130° C. or below.

11. A polyimide silicone resin film comprising the polyimide silicone resin according to claim 1 formed on a substrate.

12. The polyimide silicone resin film according to claim 11, wherein said substrate is an electrode for electronic component parts or semiconductor devices.

13. A method of making a polyimide silicone resin, the method comprising
   reacting a diamine and an acid anhydride; and
   producing the resin of claim 1.

* * * * *